United States Patent
Kaginele

(10) Patent No.: US 7,092,271 B2
(45) Date of Patent: *Aug. 15, 2006

(54) CAM MEMORY ARCHITECTURE AND A METHOD OF FORMING AND OPERATING A DEVICE ACCORDING TO A CAM MEMORY ARCHITECTURE

(75) Inventor: Sathya P. Kaginele, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/034,720

(22) Filed: Jan. 14, 2005

(65) Prior Publication Data

US 2005/0138280 A1    Jun. 23, 2005

Related U.S. Application Data

(63) Continuation of application No. 10/641,126, filed on Aug. 15, 2003, now Pat. No. 6,906,938.

(51) Int. Cl.
*G11C 15/00* (2006.01)

(52) U.S. Cl. .............. 365/49; 365/189.07; 365/230.03; 711/108

(58) Field of Classification Search ............ None
See application file for complete search history.

(56) References Cited

U.S. PATENT DOCUMENTS

| 4,758,983 | A  | * | 7/1988 | Berndt ................ 365/49 |
| 6,061,262 | A  |   | 5/2000 | Schultz et al. |
| 6,335,889 | B1 |   | 1/2002 | Onodera |
| 6,430,073 | B1 | * | 8/2002 | Batson et al. ........ 365/49 |
| 6,549,442 | B1 | * | 4/2003 | Lu et al. ............. 365/49 |
| 6,906,938 | B1 | * | 6/2005 | Kaginele ............. 365/49 |

* cited by examiner

*Primary Examiner*—David Lam
(74) *Attorney, Agent, or Firm*—Dickstein Shapiro Morin & Oshinsky LLP

(57) ABSTRACT

A method for operating a content addressable memory that includes receiving a first data value for evaluation at a first memory block during a first time interval, receiving a second data value for evaluation at a second memory block during a second time interval and evaluating said both the first and second data values during a third time interval. According to one embodiment of the invention the first and second time intervals are separate so that the first and second data blocks receive unique data out of phase with one another from a single address bus. Evaluation of both data values takes place substantially simultaneously in the respective memory blocks. Also included is a device architecture and a device adapted to control data transfer to two CAM memory blocks in response to alternate phase transitions of a control signal.

19 Claims, 8 Drawing Sheets

CAM MEMORY ARCHITECTURE AND A METHOD OF FORMING AND OPERATING A DEVICE ACCORDING TO A CAM MEMORY ARCHITECTURE

CROSS-REFERENCE TO RELATED APPLICATION

The present application is a continuation application of U.S. patent application Ser. No. 10/641,126, filed on Aug. 15, 2003 now U.S. Pat. No. 6,906,938, the disclosure of which is incorporated herein by reference in its entirety.

FIELD OF THE INVENTION

The present invention relates to a memory architecture and device, and more particularly to a content addressable memory architecture and device.

BACKGROUND OF THE INVENTION

A content addressable memory (CAM) is a memory device that permits rapid parallel searching of stored data to find a particular data value. In contrast to most other memory formats (such as ROM and RAM memory), which are based on address-driven storage architectures, the typical CAM memory device offers both address-driven and content-driven data access.

Address-driven memory device architectures are well-known. According to an address-driven architecture, during a memory access, a user supplies an address and stores data, or retrieves data previously stored, at that specific address. For example, in an address-driven architecture, data values may be stored at a particular logical address by specifying the address on an address bus, and supplying data on a data bus to be stored at the specified address. In the same fashion, data may be retrieved on the data bus in response to a memory address supplied on the address bus.

As noted, the typical CAM memory device can be accessed in both address-driven and content-driven fashion. Storage of data in a CAM may be performed in an address-driven mode, as described above. Additionally, some CAM memory devices allow storage of data in a "first available storage location." For example a logical flag may be provided for each storage location of the CAM device, indicating whether a storage location contains stored data, or is available to receive new data. When a new data item is presented to the CAM device, each logical flag of the logical flag set is tested simultaneously and an unused storage location is identified. The new data item is then stored in the unused storage location, and the logical flag associated with that location is reconfigured to indicate that the location is in use.

As with data storage, data retrieval in a CAM memory may be performed on an address-driven basis. More importantly, however, CAM memory provides content-driven data retrieval. In a content-driven data retrieval, a data pattern is presented to the CAM memory device. If the CAM memory device contains a previously stored data item of the same data pattern, that presence is indicated and the location in the CAM where the searched data is stored is identified and an address connected with the matched data is returned. The CAM memory device is structured to perform the search on a highly parallel basis, conducting the search on all the data in the CAM substantially simultaneously. Consequently, a CAM can provide search results much more rapidly than an address-driven memory device, in which searches are typically performed serially, one address at a time.

The content-driven data retrieval facility of a CAM memory is typically implemented by providing an array of storage cells connected in an extensive wired-or configuration. This architecture allows a multi-bit data word applied to an input of the CAM device to be compared, substantially simultaneously, with the data words stored in every location of the CAM.

FIG. 1 shows a simplified schematic representation of a CAM memory device 10, as known in the art. The CAM device includes a search register 12 and a plurality of storage words 14. Each storage word 14 includes multiple CAM memory cells 16. The search register 12 includes a corresponding plurality of search register bits 18. The search register 12 is coupled to each of the storage words 14 by a parallel bus 20, so that each cell 16 (for example cell 22) of a storage word 14 is coupled to a corresponding bit (for example 24) of the search register 12. Each storage word is coupled to a corresponding match line 26. The match line 26 exhibits electrical capacitance (represented as lumped capacitance 28) and can be pre-charged to a particular electrical potential by a precharge circuit 30.

As shown at 22 each CAM memory cell 16 of each storage word 14 includes a circuit 34 adapted to switchingly couple a particular match line 27 to ground 32. The circuit includes an input 36 coupled to the data bus 20. The input 36 is coupled to a gate of a transistor 38. Transistor 38 is coupled in series with another transistor 40 between the particular match line 27 and ground 32. Input 36 is also coupled, through an inverter 42, to a gate of another transistor 44. Transistor 44 is coupled in series with another transistor 46 between the particular match line 27 and ground 32. A gate of transistor 46 is coupled to a memory element 50. The memory element 50 controls the gate of transistor 46 according to a binary value D stored within memory element 50. A gate of transistor 40 is coupled to a memory element 48. The memory element 48 controls the gate of transistor 40 according to a binary value equal to the complement of D stored within memory element 48.

If the binary data received at input 36 is not equal to D, then the particular match line 27 is switchingly coupled to ground 32 through either transistor 38 and transistor 40 or transistor 44 and transistor 46. If the binary data received at input 36 is equal to D, then the particular circuit 34 does not ground the particular match line 27. If the data values received at the other respective inputs of the particular storage word 29 all match the corresponding "D" values of the respective memory cells 16 of storage word 29, then the particular match line 27 is not grounded at all. Accordingly, match line 27 remains at a detectably high potential, and a data match between the data values held in the search register 12 and the particular storage word 29 is indicated.

In operation, each match line is charged to a precharge voltage by the action of the precharge circuit 30. A binary value is stored in the search register 12. Corresponding binary values are applied to the storage words 14 over the parallel bus 20. If a bit value in the search register differs from a corresponding bit value in a search word 14, that search word switches to provide an electrical path between the respective match line 26 and ground 32. The capacitance 28 of the match line 26 is thus discharged, indicating, by a resulting low match line voltage, that the value in the storage word 14 does not match the value in the search register 12. If a match line remains high (ungrounded), this indicates that the storage word 14 coupled to that match line 26 contains the same value as that present in the search register 12.

In at least some prior art CAM devices, memory cells are arranged in a plurality of memory blocks on a substrate. Each memory block is connected to a respective dedicated data bus that supplies data to the memory block. Different data can be provided on each dedicated data bus. As a result different data may be searched in different memory blocks at the same time. A device 100 constructed according to this architecture is shown in FIG. 2.

FIG. 2 shows a substrate 201 on which are formed first 202 and second 204 memory blocks. Each memory block includes a plurality of CAM memory cells 16 formed on the substrate. The first memory block 202 has a first data input port 206 coupled to a first search register 208. The second memory block 204 has a second data input port 210 coupled to a second search register 212. The first 208 and second 212 search registers are each coupled to a respective search data bus 215, 217. A first control line 219 is coupled to a first control input 218 of the first memory block 202 and a second control input 222 of the first search register 208. A second control line 221 is coupled to a third control input 220 of the second memory block 204 and to a fourth control input 224 of the second search register 212.

A control circuit 226 is coupled to the control lines 219, 221. The control circuit 226 is adapted to apply respective control signals to the control lines 219, 221, thereby initiating comparisons between the values in the search registers 208, 212 and storage words made up of memory cells 16 within the corresponding memory blocks 202, 204. Because each memory block has its own data bus 219, 221, this arrangement is costly in terms of device complexity and associated manufacturing yields, device real estate, and device energy and thermal budgets.

This costliness is a factor in the economics of CAM applications. Accordingly it is desirable to produce a CAM a memory integrated circuit having an improved data bus architecture.

BRIEF SUMMARY OF THE INVENTION

An exemplary embodiment of the present invention includes an architecture for a memory integrated circuit that exhibits greater areal efficiency and reduced complexity as compared with prior art designs. In one aspect of the invention, data on a data bus is time multiplexed so as to reduce the requirement for data conductors on an integrated circuit. Consequently, in one embodiment, the present invention includes a CAM that is compact as compared with prior art CAM devices. According to one embodiment of the invention, a CAM device includes an integrated circuit device with two or more memory blocks of CAM memory cells. The memory blocks of CAM memory cells are supported by a substrate. The substrate also supports a data bus that is mutually coupled to two search registers of at least two of the memory blocks respectively. The data bus supplies data to the two search registers according to alternating transitions of a periodic clock signal.

According to one embodiment, the invention includes a method for operating a content addressable memory that includes receiving a first data value for evaluation at a first memory block during a first time interval, receiving a second data value for evaluation at a second memory block during a second time interval and evaluating said both the first and second data values during a third time interval. According to one embodiment of the invention the first and second time intervals are separate so that the first and second data blocks receive unique data out of phase with one another from a single address bus. Evaluation of both data values takes place substantially simultaneously in the respective memory blocks.

The above and other features and advantages of the invention will be more readily understood from the following detailed description of the invention which is provided in connection with the accompanying drawings.

DETAILED DESCRIPTION OF THE INVENTION

In one exemplary embodiment, the present invention includes a CAM memory device architecture in which a single data bus is used to convey data to two memory blocks of a single CAM memory device in time multiplexed form. Respective data values are provided to the two memory blocks according to alternating phase transitions of a control signal. Consequently, a single data bus serves the function of two separate prior art data buses. The result is a savings in integrated circuit real estate and complexity, since one data bus is provided rather than two. Various exemplary aspects of the invention are directed to the architecture, and its method of formation, and to operation of a CAM memory device according to the invention.

Figure 3:
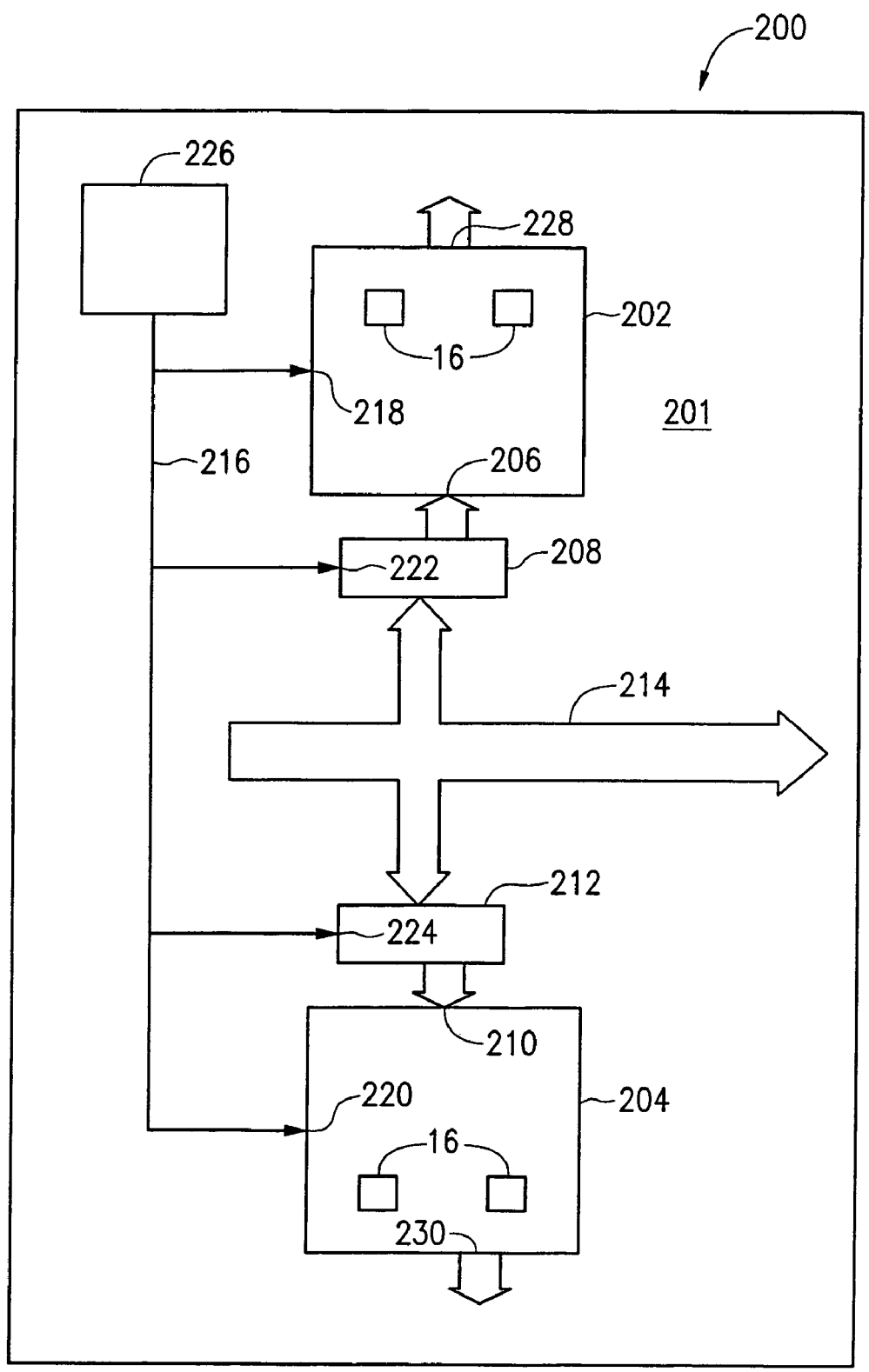
FIG. 3 shows a content addressable memory device in block diagram form according to one embodiment of the invention.

FIG. 3 shows an exemplary CAM memory device 200 according to one embodiment of the invention. The CAM device 200 includes a substrate 201. The substrate may include any supporting structure including, but not limited to a semiconductor substrate that has an exposed substrate surface. The substrate may be a semiconductor substrate or other substrate. Semiconductor substrates should be understood to include silicon, silicon-on-insulator (SOI), silicon-on-sapphire (SOS), doped and undoped semiconductors, epitaxial layers of silicon supported by a base semiconductor foundation, and other semiconductor structures. The substrate may include regions or junctions in or over the base semiconductor or foundation formed during preparatory process steps.

A plurality of CAM memory cells 16 are formed on the substrate. According to one embodiment, the cells are arranged into discrete memory blocks 202, 204. One of the memory blocks 202 has a first data input port 206 coupled to a first search register 208. Another of the memory blocks 204 has a second data input port 210 coupled to a second search register 212. The first 208 and second 212 search registers are mutually coupled to a single search data bus 214.

Figure 1:
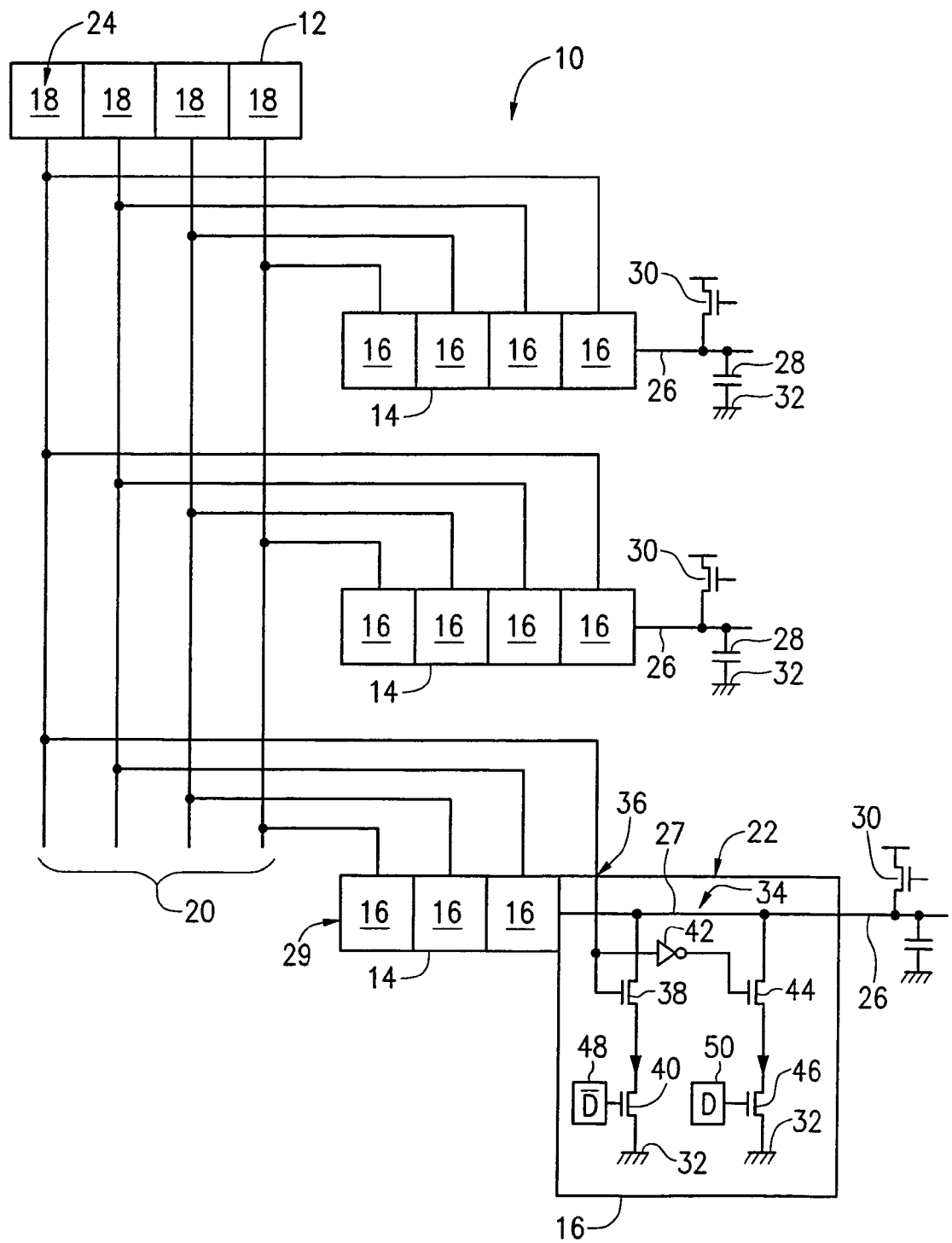
FIG. 1 shows a simplified representation of a portion of a conventional content addressable memory device in block diagram form.
Figure 2:
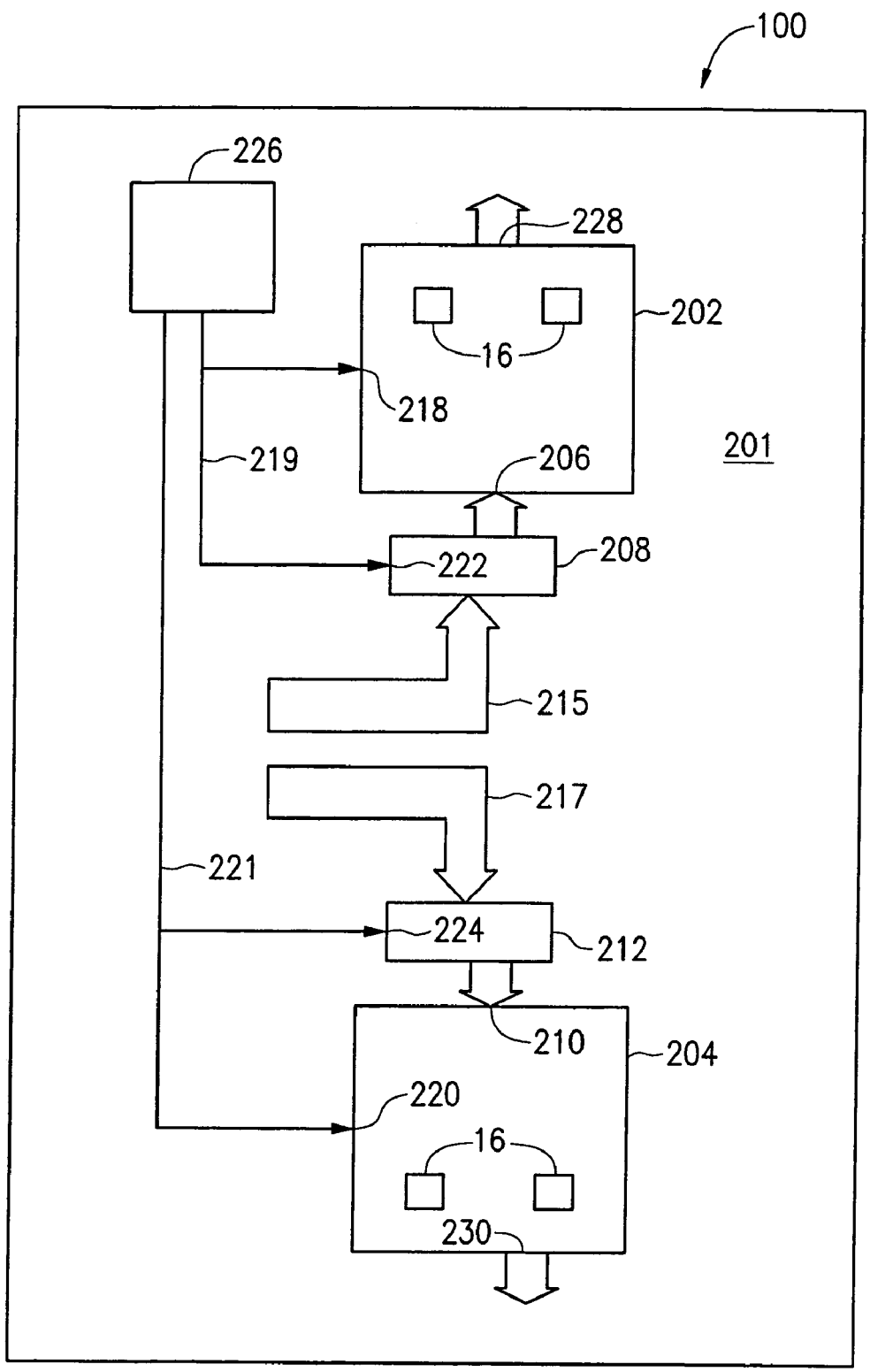
FIG. 2 shows a simplified representation of a portion of a conventional content addressable memory device in block diagram form.

The search data bus consists of a plurality of data lines coupled to provide data in parallel format to the first search register 208 and second search register 212. In an alternative embodiment of the invention, the data bus may consist of one or more data lines adapted to provide data in serial format to the first search register 208 and second search register 212. The data lines may include various transmission media such as strip-lines, micro-strip lines, or waveguide structures including optical waveguide structures. In one embodiment, the inverter 42 (as shown in FIG. 1) is omitted from the CAM memory cells 16, and the data bus 214 includes complemented data lines.

A control line 216 is mutually coupled to a first control input 218 of the first memory block 202 and a second control input 220 of the second memory block 204. The control line 216 is also mutually coupled to a third control input 222 of the first search register 208 and to a fourth control input 224 of the second search register 212. The control line may be formed of conductive material such as polysilicon or metallic material, or the control line may be formed as a waveguide, such as an optical waveguide. A control circuit 226 is formed on the substrate 201 and coupled to the control line 216. The control circuit 226 is adapted to apply a control signal 304 (as discussed below in relation to in FIG. 4) to the control line 216. According to various embodiments of the invention, buffer circuits adapted to amplify control or data signals may be provided on the substrate 201 in conjunction with the data bus and/or control signal lines.

As shown in FIG. 3, the memory blocks 202, 204 are disposed in spaced relation to one another. The search registers 208, 212 and the search data bus 214 are disposed between the memory blocks 202 and 204.

Figure 4:
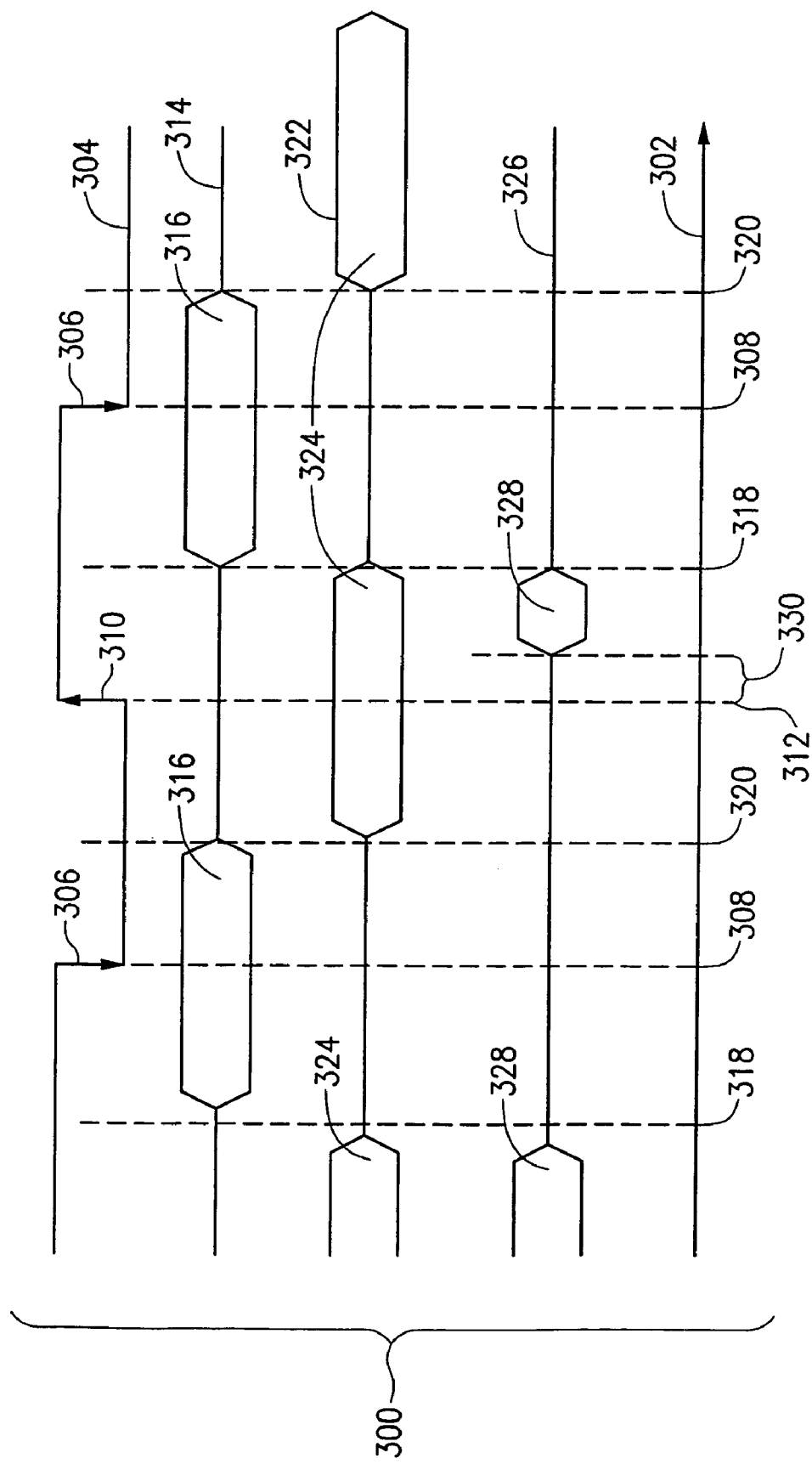
FIG. 4 shows a signal timing diagram including control signal timing according to one embodiment of the invention.

FIG. 4 shows a timing diagram 300 indicating signal timing relationships for operation of the FIG. 3 CAM memory device. Reference is made to a time axis 302. A control signal 304 is shown as a substantially periodic substantially symmetric square wave signal. The control signal 304 includes downward transitions 306 at periodically repeating times 308 and upward transitions 310 at periodically repeating times 312. Graph 314 shows the time intervals 316 when first data, destined for the first search register 208, is stable on the search data bus 214. These time intervals 316 begin at periodically repeating times 318 and end at periodically repeating times 320. Graph 322 shows the further time intervals 324 when second data, destined for the second search register 212, is stable on the search bus 214. These further time intervals 324 begin at periodically repeating times 320 and end at periodically repeating times 318. Graph 326 shows the time intervals 328 during which stable output data is available at output port 228 of memory block 202 and output port 230 of memory block 204. An evaluation time interval beginning at periodic time 312 is indicated by reference numeral 330.

Figure 5:
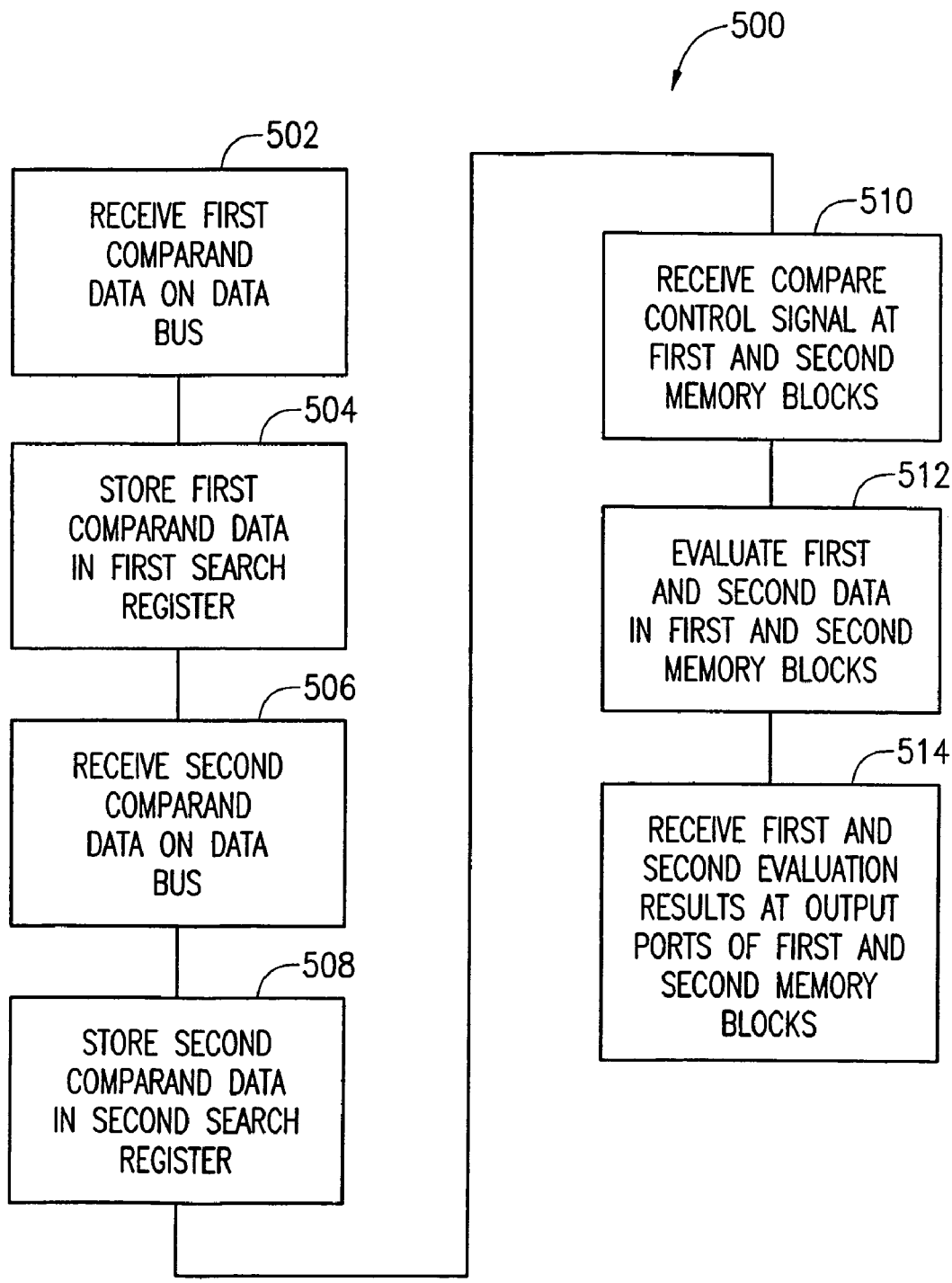
FIG. 5 shows a flowchart showing steps for a read operation according to one embodiment of the invention.

FIG. 5 shows a flowchart 500 illustrating steps for reading a content addressable memory device according to one embodiment of the invention. In a first step 502 first comparand data is received onto data bus 214 (as shown in FIG. 3). In a second step 504 the first comparand data is latched into first search register 208. The latching of first comparand data into first search register 208 is triggered by downward transition 306 of signal 304, (as shown in FIG. 4). Referring again to FIG. 5, in a third step 506 second comparand data is received on to data bus 214. In a fourth step 508 second comparand data is latched into second search register 212. In the instant embodiment, latching of second comparand data into second search register 212 is triggered by upward transition 310 of signal 304 (a shown in FIG. 4). The upward transition 310 is also received at the first 202 and second 204 memory blocks, as shown in step 510 of FIG. 5. As shown in step 512, the upward transition 310 of signal 304 also initiates the evaluation of fist data in first memory block 202 and second memory block 204. This evaluation takes place during time interval 330 (as shown in FIG. 4). In step 514, first evaluation results are received at first output 228 of first memory block 202 and at second output 230 of second memory block 204. This takes place during periodic time interval 328 (as shown in FIG. 4).

Figure 6:
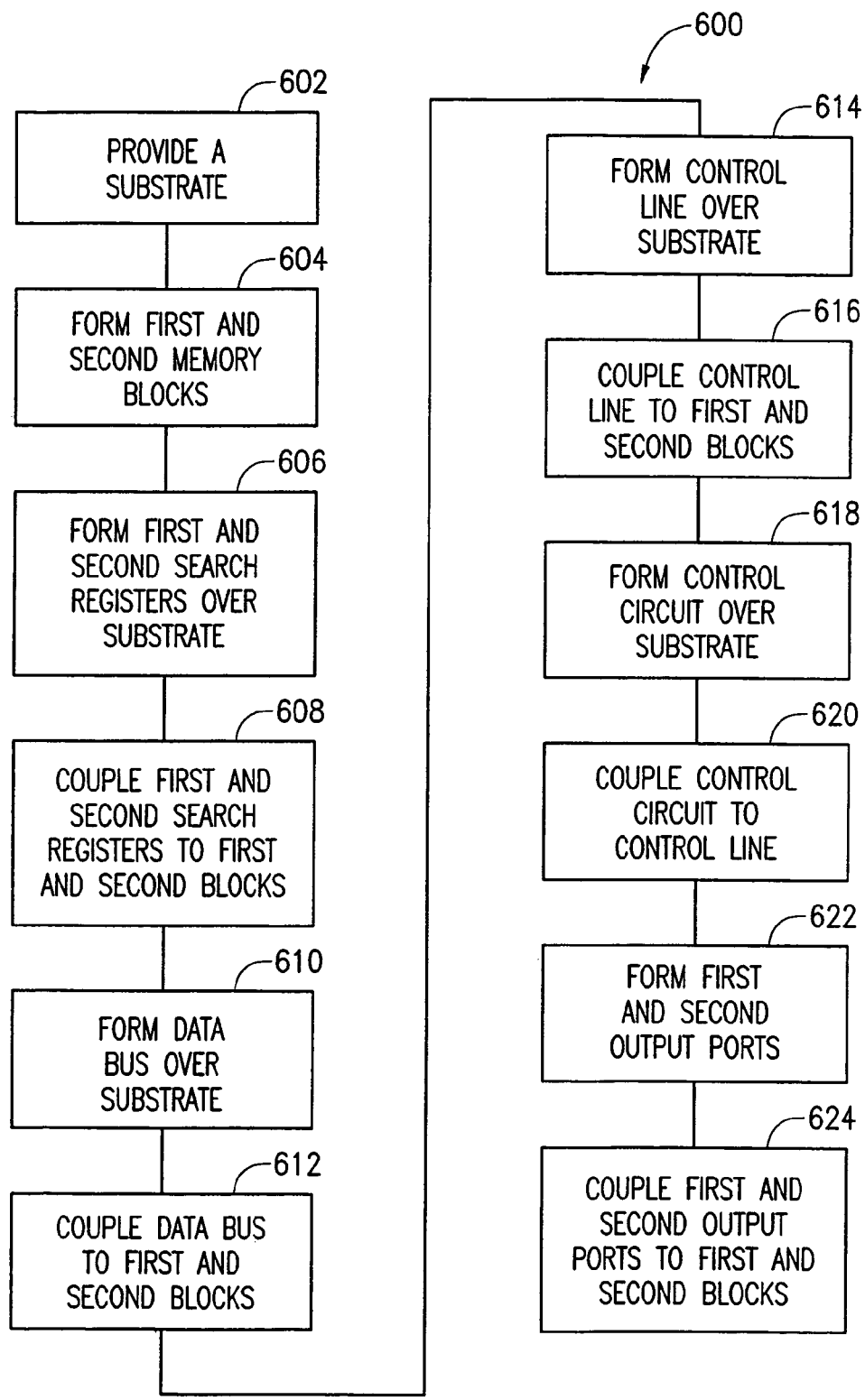
FIG. 6 shows a flowchart for manufacturing a content addressable memory device according to one embodiment of the invention.

FIG. 6 shows a flowchart 600 illustrating the steps for manufacturing, according to one embodiment of the invention, a content addressable memory device. In a first step 602 a substrate is provided. In a second step 604 a plurality of CAM memory cells are formed on the substrate 201. The cells are formed in at least first 202 and second 204 blocks of cells. In a third step 606, first 208 and second 212 search registers are formed on the substrate 201. In step 608, the first search register 208 is coupled to the first memory block 202 and second search registered 212 is coupled to the second memory block 204. In step 610 data bus 214 is formed over the substrate 201. As described above, the data bus may include a parallel or serial architecture data bus, and may include a variety of transmission media, including conductors, transmission lines, and waveguides including optical waveguides. In step 612 the data bus is coupled to both the first 208 and second 212 search registers. In step 614 a control line is formed over the substrate. In step 616, the control line is coupled to the first 208 and second 212 search registers and to the first 202 and second 204 memory blocks. In step 618 a control circuit 226 is formed over the substrate, and in step 620, and output of the control circuit 226 is coupled to the control line 216. In step 622 first 228 and second output ports 230 are formed over the substrate. In step 624, the first output port 228 is coupled to the first memory block 202 and second output port 230 is coupled to the second memory block 204.

Figure 7:
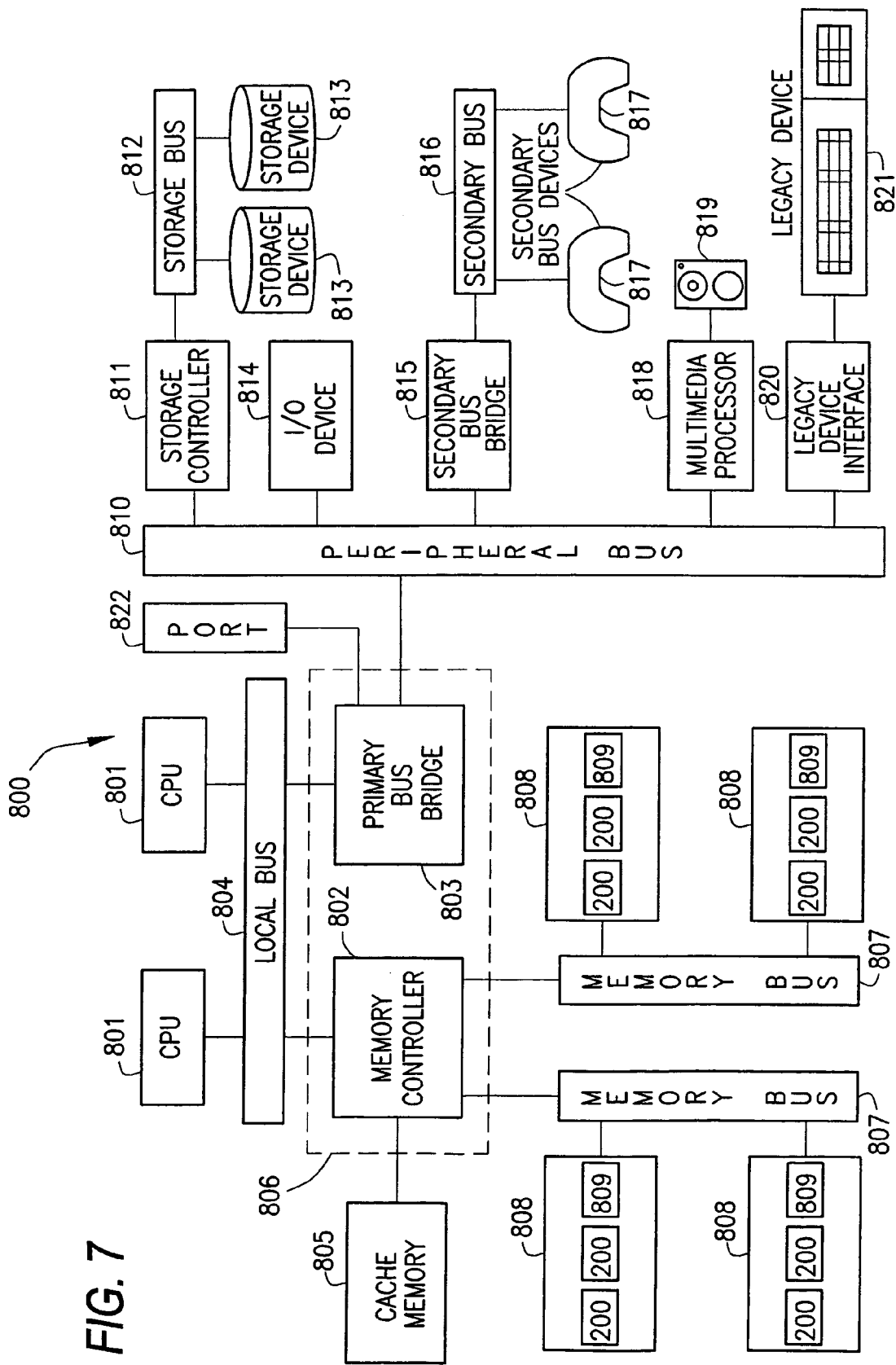
FIG. 7 shows a digital system including a content addressable memory according to one aspect of the invention.

FIG. 7 illustrates an exemplary processing system 800 which utilizes a CAM device 200 constructed as described above with reference to FIGS. 1–6. The processing system 800 includes one or more processors 801 coupled to a local bus 804. A memory controller 802 and a primary bus bridge 803 are also coupled the local bus 804. The processing system 800 may include multiple memory controllers 802 and/or multiple primary bus bridges 803. The memory controller 802 and the primary bus bridge 803 may be integrated as a single device 806.

The memory controller 802 is also coupled to one or more memory buses 807. Each memory bus accepts memory components 808, which include at least one memory device 200 of the invention. Alternatively, in a simplified system, the memory controller 802 may be omitted and the memory components directly coupled to one or more processors 801. The memory components 808 may be a memory card or a memory module. The memory components 808 may include one or more additional devices 809. For example, the additional device 809 might be a configuration memory. The memory controller 802 may also be coupled to a cache memory 805. The cache memory 805 may be the only cache memory in the processing system. Alternatively, other devices, for example, processors 801 may also include cache memories, which may form a cache hierarchy with cache memory 805. If the processing system 800 include peripherals or controllers which are bus masters or which support direct memory access (DMA), the memory controller 802 may implement a cache coherency protocol. If the memory controller 802 is coupled to a plurality of memory buses 807, each memory bus 807 may be operated in parallel, or different address ranges may be mapped to different memory buses 807.

The primary bus bridge 803 is coupled to at least one peripheral bus 810. Various devices, such as peripherals or additional bus bridges may be coupled to the peripheral bus 810. These devices may include a storage controller 811, a miscellaneous I/O device 814, a secondary bus bridge 815, a multimedia processor 818, and a legacy device interface 820. The primary bus bridge 803 may also coupled to one or more special purpose high speed ports 822. In a personal computer, for example, the special purpose port might be the Accelerated Graphics Port (AGP), used to couple a high performance video card to the processing system 800.

The storage controller 811 couples one or more storage devices 813, via a storage bus 812, to the peripheral bus 810. For example, the storage controller 811 may be a SCSI controller and storage devices 813 may be SCSI discs. The I/O device 814 may be any sort of peripheral. For example, the I/O device 814 may be an local area network interface, such as an Ethernet card. The secondary bus bridge may be used to interface additional devices via another bus to the processing system. For example, the secondary bus bridge may be a universal serial port (USB) controller used to couple USB devices 817 via a secondary bus 816 and the secondary bus bridge 815 to the processing system 800. The multimedia processor 818 may be a sound card, a video capture card, or any other type of media interface, which may also be coupled to one or more additional devices such as speakers 819. The legacy device interface 820 is used to couple one or more legacy devices 821, for example, older styled keyboards and mice, to the processing system 800.

The processing system 800 illustrated in FIG. 7 is only an exemplary processing system with which the invention may be used. While FIG. 7 illustrates a processing architecture especially suitable for a general purpose computer, such as a personal computer or a workstation, it should be recognized that well known modifications can be made to configure the processing system 800 to become more suitable for use in a variety of applications. For example, many electronic devices which require processing may be implemented using a simpler architecture which relies on a CPU 801 coupled CAM memory devices 200.

Figure 8:
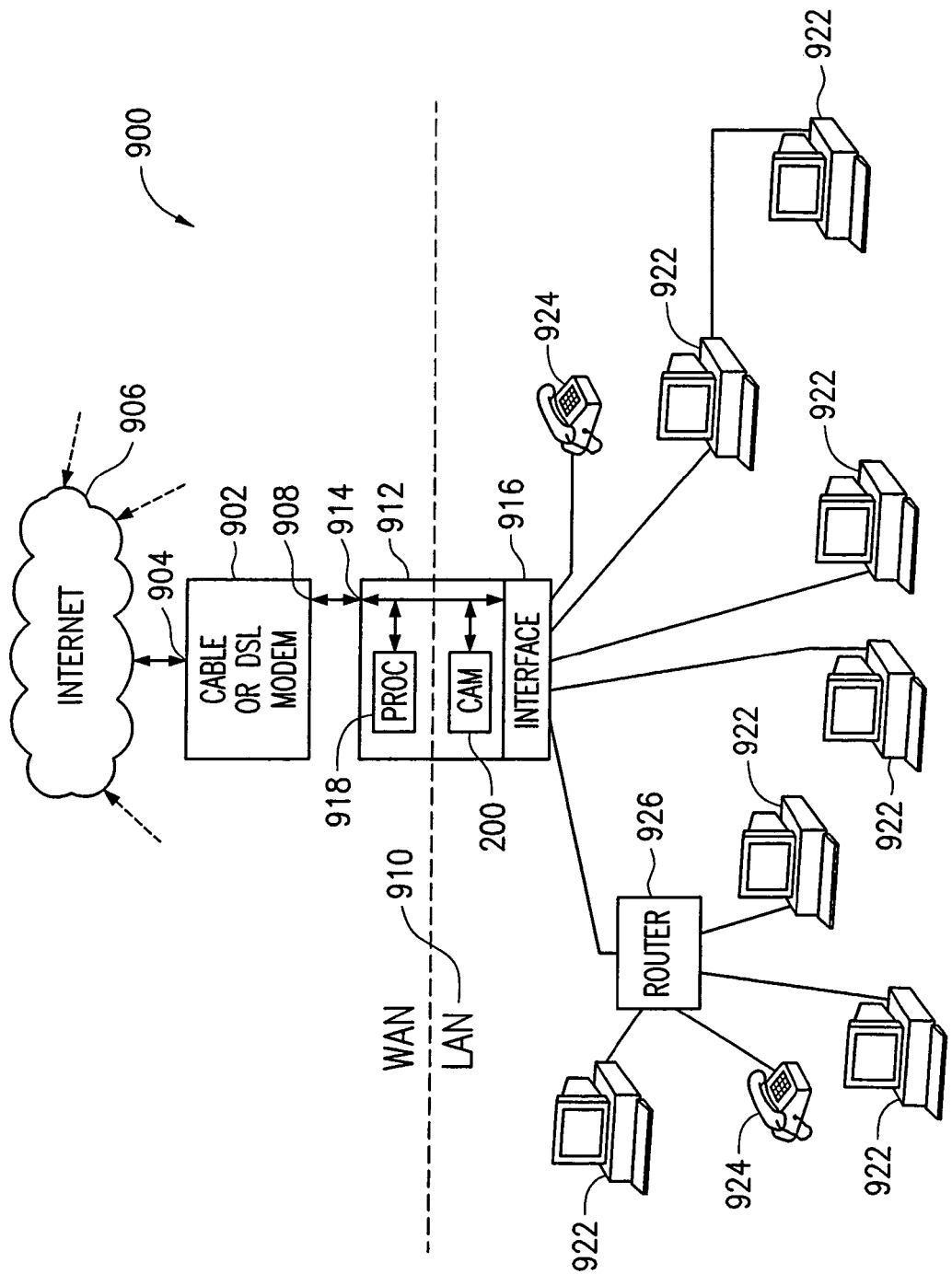
FIG. 8 shows a communications network including a router with a content addressable memory according to one aspect of the invention.

FIG. 8 shows a communications network 900 according to one aspect of the invention. The network includes a modem 902 having a first port 904 adapted to be coupled to the Internet 906 and a second port 908 adapted to be coupled to a local area network 910. A router 912 has a remote-side port 914 coupled to the second port 908 of the modem, and an interface 916 including a plurality of local ports for connection to local devices. The router 912 includes a processor 918 for receiving and processing information received from and/or destined for the local devices. The router also includes a content accessible memory device 200 according to one embodiment of the invention, as described above. The content accessible memory 200 is coupled to the processor 918 and adapted to store and retrieve data under the control of the processor. A variety of local devices are coupled to respective local ports, of the interface 916, including general-purpose computers 922, telephone devices 924, and network router devices 926.

The description and drawings presented above illustrate only a few of the many embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A content addressable memory comprising:
   first and second search registers for storing first and second search data to be compared with first and second stored data stored in respective first and second memory blocks;
   a data bus for providing first and second search data to said first and second registers, respectively, said data bus being coupled to said first search register and said second search register; and
   a control circuit mutually coupled to said first search register and to said second search register, said control circuit being operable to provide a first and second control signal to control said first and second search registers such that first search data from said data bus is received by said first search register during a first time interval and second search data from said data bus is received by said second search register during a second time interval.

2. A content addressable memory as in claim 1, wherein:
   said first memory block being capable of comparing said first stored data to said first search data and providing a first comparison output; and
   said second memory block being capable of comparing said second stored data to said second search data and providing a second comparison output.

3. A content addressable memory as in claim 2 wherein said control circuit is mutually coupled to said first memory block and to said second memory block, said control circuit being operable to provide signals such that said first and second search data are evaluated by said first and second memory blocks during a third time interval.

4. A content addressable memory as in claim 3, wherein said data bus is a serial data bus.

5. A content addressable memory as in claim 3, wherein said data bus is a parallel data bus.

6. A content addressable memory as in claim 3, wherein said data lines are strip lines.

7. A content addressable memory as in claim 3, wherein said data lines are waveguide structures.

8. A method of forming a content addressable memory comprising:
   forming first and second memory blocks over a substrate for storing first and second stored data;
   forming first and second search registers for storing first and second search data to be compared with said first and second stored data, said first and second search registers respectively coupled to said first and second memory blocks;
   forming a data bus over said substrate for providing first and second search data to said first and second registers, respectively, said data bus being coupled to said first search register and said second search register; and
   forming a control circuit over said substrate coupled to said first search register and to said second search register, said control circuit being operable to provide a first and second control signal to control said first and second search registers such that first search data from said data bus is received by said first search register during a first time interval and second search data from said data bus is received by said second search register during a second time interval.

9. A method of forming a content addressable memory as defined in claim 8, wherein:
said first memory block being capable of comparing said first stored data to said first search data and providing a first comparison output; and
said second memory block being capable of comparing said second stored data to said second search data and providing a second comparison output.

10. A method of forming a content addressable memory as defined in claim 9, wherein said control circuit is mutually coupled to said first memory block and to said second memory block, said control circuit being operable to provide signals such that said first and second search data are evaluated by said first and second memory blocks during a third time interval.

11. A router comprising:
a processor; and
a content addressable memory coupled to said processor, said content addressable memory comprising:
first and second search registers for storing first and second search data to be compared with first and second stored data stored in respective first and second memory blocks;
a data bus for providing first and second search data to said first and second registers, respectively, said data bus being coupled to said first search register and said second search register; and
a control circuit mutually coupled to said first search register and to said second search register, said control circuit being operable to provide a first and second control signal to control said first and second search registers such that first search data from said data bus is received by said first search register during a first time interval and second search data from said data bus is received by said second search register during a second time interval.

12. A router as in claim 11, wherein:
said first memory block being capable of comparing said first stored data to said first search data and providing a first comparison output; and
said second memory block being capable of comparing said second stored data to said second search data and providing a second comparison output.

13. A router as in claim 12, wherein said control circuit is mutually coupled to said first memory block and to said second memory block, said control circuit being operable to provide signals such that said first and second search data are evaluated by said first and second memory blocks during a third time interval.

14. A communication network system comprising:
a plurality of computers;
a communication medium coupling said plurality of computers to a router, said router including a content addressable memory device, said content addressable memory device having:
first and second search registers for storing first and second search data to be compared with first and second stored data stored in respective first and second memory blocks;
a data bus for providing first and second search data to said first and second registers, respectively, said data bus being coupled to said first search register and said second search register; and
a control circuit mutually coupled to said first search register and to said second search register, said control circuit being operable to provide a first and second control signal to control said first and second search registers such that first search data from said data bus is received by said first search register during a first time interval and second search data from said data bus is received by said second search register during a second time interval.

15. A system as in claim 14, wherein:
said first memory block being capable of comparing said first stored data to said first search data and providing a first comparison output; and
said second memory block being capable of comparing said second stored data to said second search data and providing a second comparison output.

16. A system as in claim 15, wherein said control circuit is mutually coupled to said first memory block and to said second memory block, said control circuit being operable to provide signals such that said first and second search data are evaluated by said first and second memory blocks during a third time interval.

17. A digital system comprising:
a central processing unit;
an I/O port device coupled to said central processing unit;
a memory data bus coupled to said central processing unit; and
a content addressable memory device, said content addressable memory device including:
first and second search registers for storing first and second search data to be compared with first and second stored data stored in respective first and second memory blocks;
a data bus for providing first and second search data to said first and second registers, respectively, said data bus being coupled to said first search register and said second search register; and
a control circuit mutually coupled to said first search register and to said second search register, said control circuit being operable to provide a first and second control signal to control said first and second search registers such that first search data from said data bus is received by said first search register during a first time interval and second search data from said data bus is received by said second search register during a second time interval.

18. A system as in claim 17, wherein:
said first memory block being capable of comparing said first stored data to said first search data and providing a first comparison output; and
said second memory block being capable of comparing said second stored data to said second search data and providing a second comparison output.

19. A system as in claim 18, wherein said control circuit is mutually coupled to said first memory block and to said second memory block, said control circuit being operable to provide signals such that said first and second search data are evaluated by said first and second memory blocks during a third time interval.

* * * * *